United States Patent
Tomari

(10) Patent No.: US 6,480,979 B1
(45) Date of Patent: Nov. 12, 2002

(54) SEMICONDUCTOR INTEGRATED CIRCUITS AND EFFICIENT PARALLEL TEST METHODS

(75) Inventor: Nobuhiro Tomari, Miyazaki (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/482,511

(22) Filed: Jan. 14, 2000

(30) Foreign Application Priority Data

Mar. 23, 1999 (JP) ............................................. 11-077767

(51) Int. Cl.$^7$ ............................ G01R 31/28; G11C 29/00
(52) U.S. Cl. ............................................. 714/724; 714/718
(58) Field of Search ........................ 714/724, 718–719, 714/736, 738

(56) References Cited

U.S. PATENT DOCUMENTS 5,588,006 A * 12/1996 Nozuyama ............... 714/703
5,627,842 A * 5/1997 Brown et al. ............ 714/720
5,646,948 A * 7/1997 Kobayashi et al. ....... 365/195
5,936,900 A * 8/1999 Hii et al. .............. 365/189.05
5,996,096 A * 11/1999 Dell et al. ................. 714/41
6,044,481 A * 3/2000 Kornachuk et al. ...... 714/724
6,275,961 B1 * 8/2001 Roohparvar ........... 365/185.2

* cited by examiner

*Primary Examiner*—Albert Decady
*Assistant Examiner*—Cynthia Harris
(74) *Attorney, Agent, or Firm*—Rabin & Berdo, P.C.

(57) ABSTRACT

A semiconductor integrated-circuit device includes both conventional internal circuitry, and a selection circuit that provides external output of signals from the internal circuitry under control of a selection signal. In a parallel test system, the output terminals of a plurality of devices under test are connected to a single set of tester input terminals, at which response signals are received from each device in turn. Alternatively, each device has an internal test circuit that carries out tests in response to test control codes received from a tester, evaluates the response signals from the internal circuitry, makes a pass/fail decision, and provides the tester with the pass/fail result.

9 Claims, 14 Drawing Sheets

SEMICONDUCTOR INTEGRATED CIRCUITS AND EFFICIENT PARALLEL TEST METHODS

BACKGROUND OF THE INVENTION

This invention relates to a semiconductor integrated circuit and test method, more particularly to efficient methods of testing a plurality of semiconductor integrated circuits concurrently.

Semiconductor integrated-circuit devices are tested by a type of automatic test equipment referred to below as a tester. A test is carried out by applying a set of control signals to input terminals of the device under test (DUT), and observing the response signals at output terminals of the DUT. In functional tests, which exercise the functions of the DUT, this procedure is repeated many times, using different sets of control signals.

Tests can be classified as single tests, in which one tester tests one device, and parallel tests, in which one tester tests two or more devices at once. Parallel tests can be carried out efficiently by connecting all of the devices under test to the same output terminals of the tester, and applying the same control signals to all devices simultaneously. Due to the shrinking process rules and growing complexity of semiconductor integrated circuits, which have progressed from large-scale integration (LSI) to very-large-scale integration (VLSI) and ultra-large-scale integration (ULSI), parallel testing has become necessary in order to shorten the test time per DUT, particularly in functional tests.

With conventional integrated circuits and test methods, in a parallel test, the tester still needs separate input terminals to receive the response signals from different devices. The total required number of input terminals is at least equal to the number of devices under test multiplied by the number of output terminals per DUT. Since a tester has a fixed number of input terminals, an increase in the number of output terminals per DUT must be offset by a decrease in the number of tested devices. Recent, highly complex semiconductor devices often have very large numbers of input and output terminals, so the number of devices that can be tested concurrently may be limited severely.

A related problem is that the time needed to process the response signals from a single DUT increases as the number of response signals increases. When a tester receives response signals from a plurality of devices, the response signals must generally be processed one DUT at a time, because of limited processing resources in the tester. The advantage of parallel testing is then diminished because the tester cannot process the response signals in parallel.

SUMMARY OF THE INVENTION

An object of the present invention is to increase the number of semiconductor integrated-circuit devices that a tester can test concurrently.

Another object of the invention is to shorten the time needed for processing the response signals from the devices under test.

According to a first aspect of the invention, a semiconductor integrated circuit comprises internal circuitry performing functions that the semiconductor integrated circuit provides as a product, and a selection circuit. The selection circuit receives an external selection signal, provides external output of response signals from the internal circuitry when the external selection signal is in one state, and blocks external output of the response signals when the external selection signal is in another state. The selection circuit may also block input of control signals to the internal circuitry when the external selection signal is in the latter state.

The first aspect of the invention also provides a parallel test system in which a tester has multiple output terminals for sending selection signals individually to the devices under test, a single set of output terminals for sending control signals to all of the devices under test, and a single set of input terminals for receiving response signals from all of the devices under test. The devices are selected in turn, and response signals are received from one device at a time. The number of semiconductor integrated circuit devices that can be connected to the tester and tested concurrently is limited only by the number of selection signal output terminals.

According to a second aspect of the invention, a semiconductor integrated circuit comprises internal circuitry performing functions that the semiconductor integrated circuit provides as a product, and an internal test circuit. The internal test circuit receives an external test control code, tests the internal circuitry by generating control signals as directed by the test control code, receives response signals from the internal circuitry, decides whether the internal circuitry passes or fails, and provides external output of the pass/fail decision. The internal test circuit may also include a non-volatile memory circuit for storing the decision result.

In a parallel test system in the second aspect of the invention, the processing of response signals from the internal circuitry in all devices under test is carried out concurrently, in the devices themselves, and the pass/fail decisions are reached concurrently. The tester only has to read the pass/fail results from the devices under test. When a series of tests is carried out, the tester may read the pass/fail result of each test from each device, or wait and read the final pass/fail result of all the tests from each device. In either case, the test time is shortened. The number of devices that can be tested concurrently is also increased, because the tester only needs one pass/fail decision input terminal per device, instead of a plurality of input terminals for response signals.

DETAILED DESCRIPTION OF THE INVENTION

Figure 1:
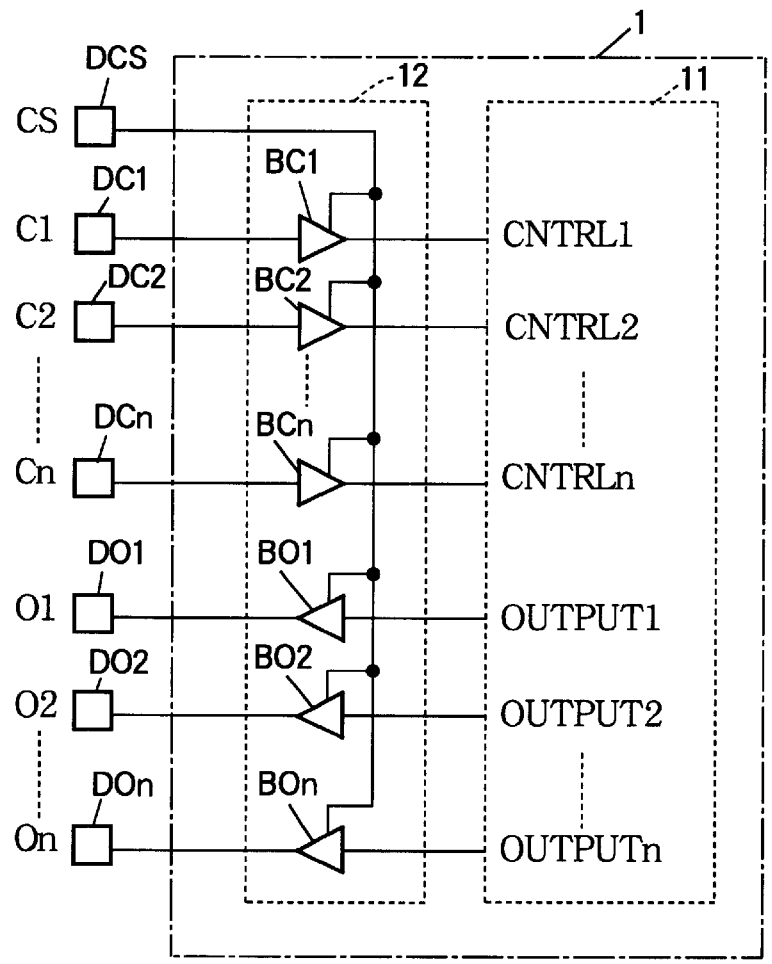
FIG. 1 is a block diagram of a semiconductor integrated-circuit device in a first embodiment of the invention.

Embodiments of the invention will be described with reference to the attached drawings, in which like parts are indicated by like reference characters.

First Embodiment

FIG. 1 shows the internal structure of a semiconductor device embodying the present invention. The semiconductor device 1 comprises internal circuitry 11 and a selection circuit 12, and has a terminal DCS for input of an external selection signal CS, terminals DC1, DC2, ..., DCn for input of external control signals C1, C2, ..., Cn, and terminals DO1, DO2, ..., DOn for output of response signals O1, O2, ..., On, where n is a positive integer.

The control signals (C1 to Cn) are received from a tester and control the operation of the internal circuitry 11, in order to test the internal circuitry 11. The response signals (O1 to On) are output by the internal circuitry 11 in response to the control signals (C1 to Cn). The selection signal (CS) is received from the tester and controls the operation of the selection circuit 12.

The internal circuitry 11 implements the functions that the semiconductor device 1 provides when used as a product. The internal circuitry 11 has input terminals CNTRL1, CNTRL2, ..., CNTRLn for the control signals (C1 to Cn), and output terminals OUTPUT1, OUTPUT2, ..., OUTPUTn for the response signals (O1 to On).

When the semiconductor device 1 is selected by the selection signal CS, the selection circuit 12 passes the control signals (C1 to Cn) received from the tester at terminals DC1 to DCn to the internal circuitry 11, and passes the response signals (O1 to On) from the internal circuitry 11 to terminals DO1 to DOn, from which terminals the response signals are returned to the tester. When the semiconductor device 1 is not selected by the selection signal CS, the selection circuit 12 blocks the control signals C1 to Cn so that they do not reach the internal circuitry 11, and blocks the response signals O1 to On so that they do not reach terminals DO1 to DOn. For this purpose, the selection circuit 12 has 2n identical three-state buffers BC1, BC2, ..., BCn, BO1, BO2, ..., BOn.

In the following description, the semiconductor device 1 is selected when the selection signal CS is at the high logic level, and is not selected when CS is at the low logic level.

Figure 2:
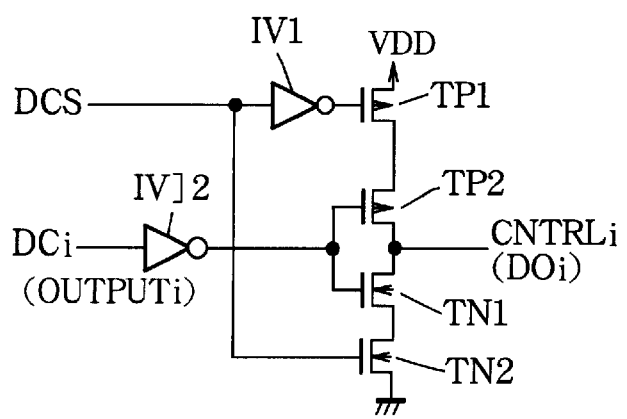
FIG. 2 is a circuit diagram showing the internal structure of the three-state buffers in FIG. 1.

FIG. 2 shows the internal structure of a three-state control-signal buffer BCi ($1 \leq i \leq n$). The terminal names in parentheses apply to a three-state response-signal buffer BOi, which has the same internal structure. The structure comprises p-channel metal-oxide-semiconductor (PMOS) transistors TP1, TP2, n-channel metal-oxide-semiconductor (NMOS) transistors TN1, TN2, and inverters IV1, IV2.

The structure shown in FIG. 2 will be familiar to those skilled in the art, and will not be described here in detail. Suffice it to say that when the selection signal input terminal DCS is at the high level, the logic level received from terminal DCi (OUTPUTi) is output at terminal CNTRLi (DOi), and when DCS is at the low level, terminal CNTRLi (DOi) is in the open or high-impedance state.

The internal circuitry 11 has a circuit configuration such that once the response signals O1 to On have settled into their final states, placing the three-state control-signal buffers BC1 to BCn in the high-impedance state does not alter the levels of the response signals O1 to On.

Figure 3:
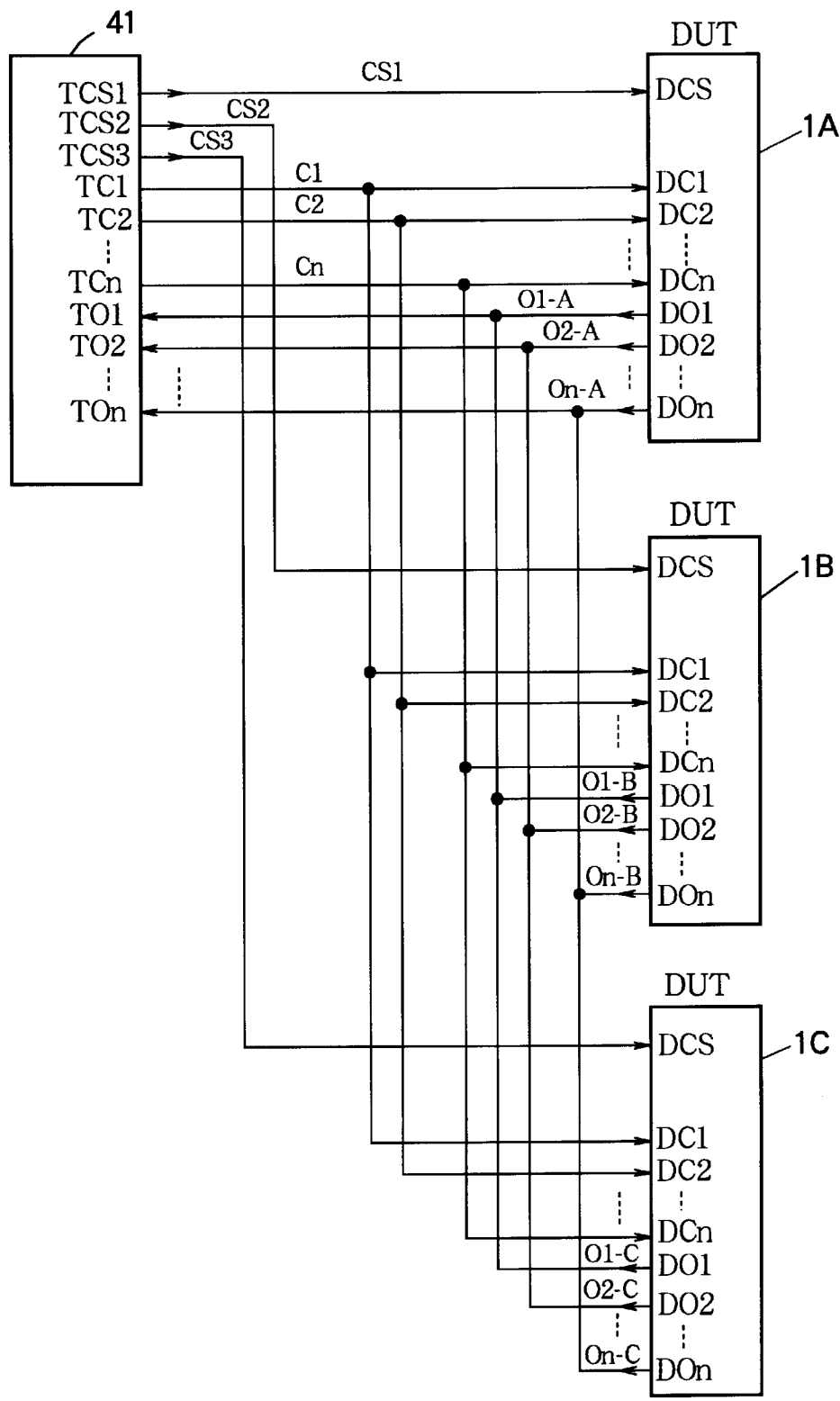
FIG. 3 is a block diagram of a parallel test system in the first embodiment.

FIG. 3 illustrates a parallel test system for testing three semiconductor devices of the type shown in FIG. 1. The three devices are identified as DUT 1A, DUT 1B, and DUT 1C. The three control signal input terminals DC of these three devices receive respective control signals CS1, CS2, CS3 from output terminals TCS1, TCS2, TCS3 of a tester 41. The tester 41 also has output terminals TC1, TC2, ..., TCn, from which the control signals C1 to Cn are fanned out to the input terminals DC1 to DCn of DUT 1A, DUT 1B, and DUT 1C, and input terminals TO1, TO2, ..., TOn, to which response signals are fanned in from the output terminals DO1 to DOn of DUT 1A, DUT 1B, and DUT 1C.

Selection signals CS1, CS2, CS3 correspond to selection signal CS in FIG. 1. Control signals C1 to Cn are the same as control signals C1 to Cn in FIG. 1. The response signals from DUT 1A are identified as O1-A, O2-A, ..., On-A. The response signals from DUT 1B are identified as O1-B, O2-B, ..., On-B. The response signals from DUT 1C are identified as O1-C, O2-C, ..., On-C. All three sets of response signals correspond to O1 to On in FIG. 1, and are connected to the single set of input terminals TO1 to TOn of the tester 41. The response signals will be denoted O1 to On when it is not necessary to distinguish among the three DUTs 1A, 1B, 1C.

The operation of this parallel test system will be described with reference to FIG. 4. Each DUT 1A, 1B, 1C must pass m tests T1, T2, ..., Tm, where m is a positive integer.

The tester 41 begins by setting all three selection signals CS1, CS2, CS3 to the high ("HN") level (step S1) and sending the control signals C1 to Cn for test T1 to all three DUTs 1A, 1B, 1C concurrently (step S2). In each DUT 1A, 1B, 1C, the selection circuit 12 passes the control signals C1 to Cn through three-state buffers BC1 to BCn to the internal circuitry 11. The internal circuitry 11 operates according to the control signals, generating response signals O1 to On (step S3). The selection circuit 12 passes these response signals O1 to On through three-state buffers BO1 to BOn to the output terminals DO1 to DOn.

After waiting for the response signals to stabilize at their final levels, the tester 41 leaves selection signal CS1 high and resets CS2 and CS3 to the low ("L") level (step S4). This places the three-state buffers BO1 to BOn in DUT 1B and DUT 1C in the high-impedance state, so that the input terminals TO1 to TOn of the tester 41 receive only the response signals O1-A to On-A from DUT 1A. The tester 41 latches these input signals O1-A to On-A (step S5).

The tester 41 now compares the response signals O1-A to On-A received from DUT 1A with the expected values or test specification (spec) values (step S6), and decides whether DUT 1A has passed (GO) or failed (NG) test T1 (step S7). Incidentally, NG stands for no-go. If DUT 1A has failed test T1, the tester 41 rejects DUT 1A as defective (step S8).

Next, the tester 41 sets selection signal CS2 to the high level and resets CS1 and CS3 to the low level (step S9). The three-state buffers BO1 to BOn in DUT 1A and DUT 1C are now in the high-impedance state, while the three-state buffers BO1 to BOn in DUT 1B supply response signals O1-B to On-B to the output terminals DO1 to DOn of DUT 1B, thus to the input terminals TO1 to TOn of the tester 41. The tester 41 latches these input signals O1-B to On-B (step S10).

The tester 41 compares the response signals O1-B to On-B received from DUT 1B with the T1 test specification values (step S11), and decides whether DUT 1B has passed or failed test T1 (step S12). If DUT 1B has failed test T1, the tester 41 rejects DUT 1B as defective (step S13).

Proceeding similarly, the tester 41 sets selection signal CS3 to the high level and places CS1 and CS2 at the low level (step S14), latches the response signals O1-C to On-C from the internal circuitry 11 of DUT 1C (step S15), compares these response signals O1-C to On-C with the T1 test specification values (step S16), and decides whether DUT 1C has passed or failed test T1 (step S17). If DUT 1C has failed test T1, the tester 41 rejects DUT 1C as defective (step S18).

This completes test T1. If all three DUTs 1A, 1B, 1C have failed test T1, the test procedure ends at this point. Otherwise, test T2 is carried out on the devices that have not yet been rejected as defective.

The tester 41 starts test T2 (step S19) by setting the selection signals of the non-rejected DUTs to the high level. If all three DUTs passed test T1, then all three selection signals CS1, CS2, CS3 are set to the high level. If, for example, DUT 1A failed test T1 while DUTs 1B and 1C passed, then selection signal CS1 is reset to the low level while CS2 and CS3 are set to the high level. The tester 41 also outputs the control signals C1 to Cn for test T2. Step S19 is equivalent to steps S1 and S2, except that the selection signals for any DUTs that have already been rejected are reset to the low level.

In the DUTs that have not yet been rejected, the control signals C1 to Cn are passed to the internal circuitry 11, which operates accordingly and generates response signals O1 to On (step S20).

The tester 41 obtains the response of DUT 1A by setting selection signal CS1 to the high level, resetting CS2 and CS3 to the low level, and latching the-response signals O1-A to On-A generated by the internal circuitry 11 in DUT 1A (step S21). By comparing these response signals with the specification values for test T2. the tester 41 decides whether DUT 1A passes or fails test T2, and rejects DUT 1A as defective if it has failed (step S22). Step S21 is similar to steps S4 and S5, while step S22 is similar to steps S6, S7, and S8. Steps S21 and S22 are skipped if DUT 1A was rejected in test T1.

Continuing in the same way, the tester 41 obtains the response of DUT 1B by setting selection signal CS2 to the high level and CS1 and CS3 to the low level, and latching the response signals O1-B to On-B (step S23). By comparing these response signals with the specification values for test T2, the tester 41 decides whether DUT 1B passes or fails test T2, and rejects DUT 1B as defective if it has failed (step S24). Step S23 is similar to steps S9 and S10, while step S24 is similar to steps S11, S12, and S13. Steps S23 and S24 are skipped if DUT 1B was rejected in test T1.

The tester 41 also obtains the response of DUT 1C, by setting selection signal CS3 to the high level and CS1 and CS2 to the low level and latching the response signals O1-C to On-C (step S25). By comparing these response signals with the specification values for test T2, the tester 41 decides whether DUT 1C passes or fails test T2, and rejects DUT 1C as defective if it has failed (step S26). Step S25 is similar to steps S14 and S15, while step S26 is similar to steps S16, S17, and S18. Steps S25 and S26 are skipped if DUT 1C was rejected in test T1.

Tests T3 to Tm−1 are carried out in the same way as test T2 (step S27), each test being carried out on the DUTs that have not been rejected in any previous test.

If at least one DUT passes all of the first m−1 tests without being rejected, the tester 41 begins test Tm by setting the selection signals of the non-rejected DUTs to the high level and outputting the control signals C1 to Cn for test Tm (step S28). In the non-rejected DUTs, the control signals C1 to Cn are passed to the internal circuitry 11, which operates accordingly and generates response signals O1 to On (step S29).

Allowing time for the response signals to reach their final states, the tester 41 sets selection signal CS1 to the high level and selection signals CS2 and CS3 to the low level, and latches the response signals O1-A to On-A from DUT 1A (step S30). By comparing these response signals with the Tm test specification values (step S31), the tester 41 decides whether DUT 1A passes or fails test Tm (step S32). DUT 1A is accepted as a non-defective device if it passes test Tm (step S33), and is rejected as defective if it fails test Tm (step S34). Steps S30 to S34 are skipped if DUT 1A has already been rejected because it failed an earlier test (T1 to Tm−1).

Next, the tester 41 sets selection signal CS2 high and selection signals CS1 and CS3 low, and latches the response signals 01-B to On-B from DUT 1B (step S35). The tester 41 compares these response signals with the Tm test specification values (step S36), and decides whether DUT 1B passes or fails test Tm (step S37). DUT 1B is accepted as non-defective if it passes test Tm (step S38), and rejected as defective if it fails test Tm (step S39). Steps S35 to S39 are skipped if DUT 1B has already failed an earlier test (T1 to Tm−1).

The tester 41 then sets selection signal CS3 high and selection signals CS1 and CS2 low, and latches the response signals O1-C to On-C from DUT 1C (step S40). The tester 41 compares these response signals with the Tm test specification values (step S41), decides whether DUT 1C passes or fails test Tm (step S42), and rejects (step S43) or accepts (step S44) DUT 1C accordingly. Steps S40 to S44 are skipped if DUT 1C has already failed an earlier test (T1 to Tm−1). This completes the test procedure.

Figure 4:
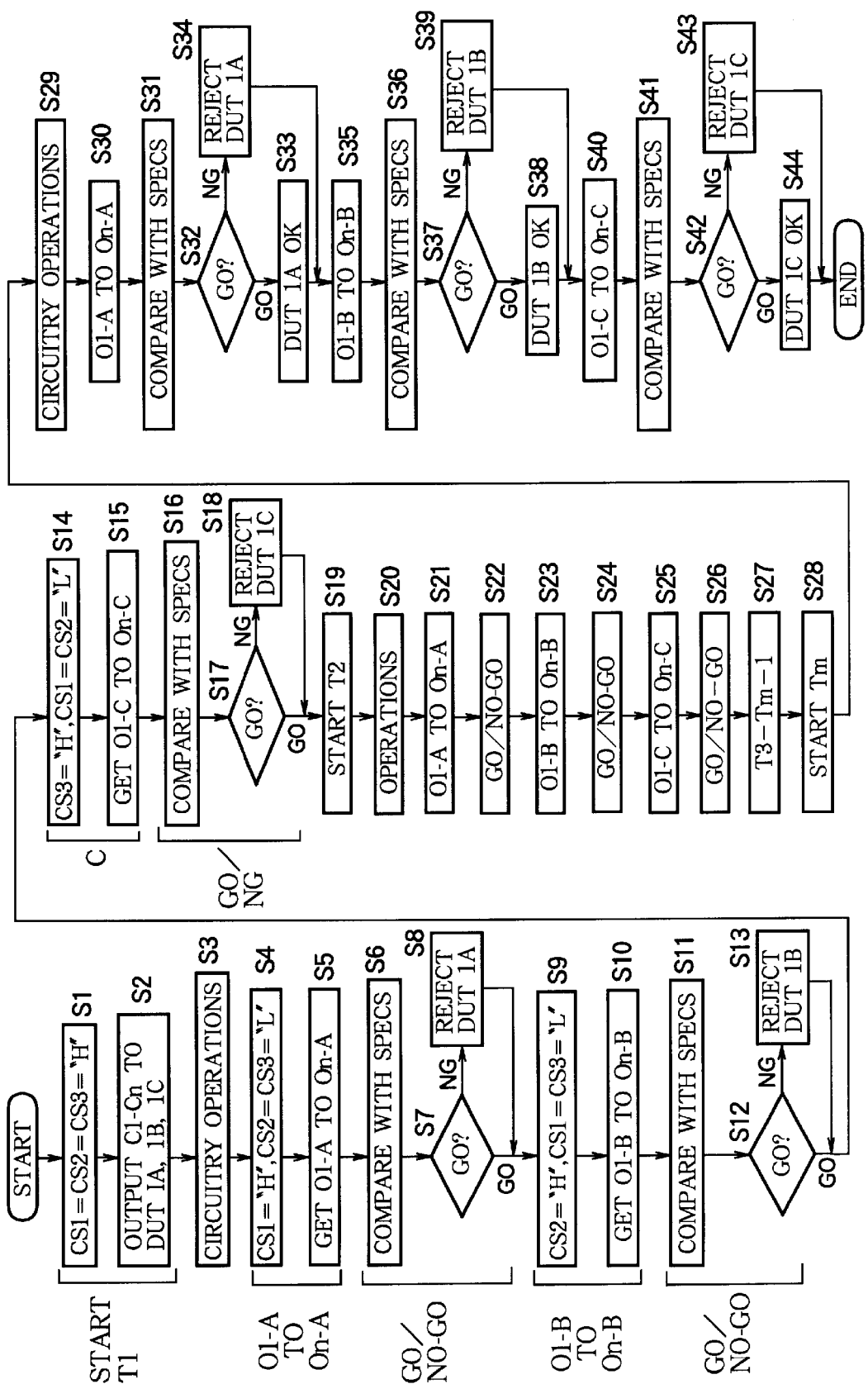
FIG. 4 is a flowchart illustrating the operation of the parallel test system in FIG. 3.

Although only three devices were tested in FIGS. 3 and 4, the selection circuits 12 enable an arbitrary number of devices to be tested concurrently by a single tester, which obtains the response signals from all devices under test in turn at a single set of input terminals. The number of devices under test is limited only by the number of selection signal output terminals of the tester, and is not limited by the number of input terminals of the tester. By enabling a comparatively large number of DUTs to be connected to and disconnected from the tester 41 in a single batch, the first embodiment shortens the physical handling time per DUT, thereby shortening the test time per DUT. By sending control signals to this large number of DUTs concurrently, the first embodiment further shortens the test time per DUT.

In addition, although a large number of devices are connected to the tester 41 concurrently, as soon as a DUT is found to be defective, it is ignored in further tests, so no time is wasted by processing response signals from known defective devices.

In a variation of the first embodiment, the three-state control-signal buffers BCi are eliminated from the selection circuit 12, and the control-signal input terminals DCi are connected directly to the control input terminals CNTRLi of the internal circuitry 11. The same effects are achieved, but the tester 41 may consume slightly more power, since rejected DUTs continue to receive control signals and perform internal operations.

Figure 5:
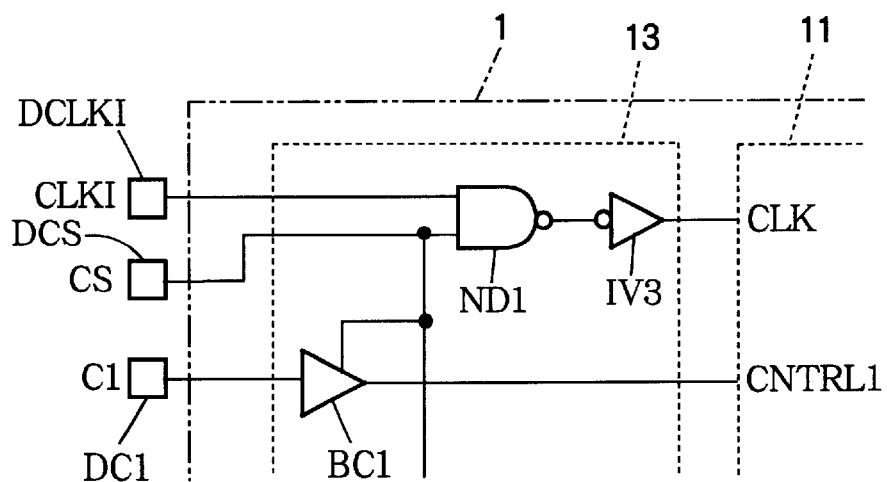
FIG. 5 is a partial block diagram illustrating a variation of the device in FIG. 1.

In another variation, the selection circuit 12 is replaced by the modified selection circuit 13 partly shown in FIG. 5. The internal circuitry 11 in this variation operates on an input clock signal CLKI, which is received by the semiconductor device 1 at a clock input terminal DCLKI. The selection circuit 13 has a two-input NAND gate ND1 that receives the clock signal CLKI from the clock input terminal DCLKI and the selection signal CS from selection signal input terminal DCS. The output of the NAND gate ND1 is inverted by an inverter IV3 and supplied to a clock input terminal CLK of the internal circuitry 11. In this variation, when the semiconductor device 1 is not selected, its internal clock is halted at the low logic level, because the selection signal CS is held low. As a result, the internal circuitry 11 is placed in a standby state, and power consumption is reduced.

The selection circuit 13 in FIG. 5 also includes the same three-state buffers as the selection circuit 12 in FIG. 1. This variation is useful when the internal circuitry 11 comprises, for example, a central processing unit, as in a microprocessor or microcontroller.

In the preceding description, the number of control signals (n) was equal to the number of response signals (n), but these two numbers may be unequal. This remark also applies to the following embodiments.

Second Embodiment

Figure 6:
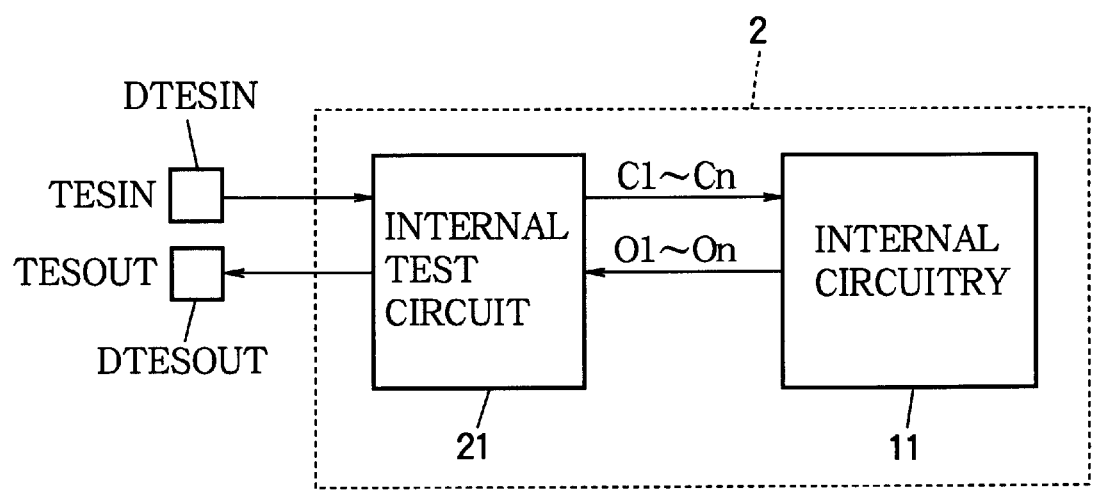
FIG. 6 is a block diagram of a semiconductor integrated-circuit device in a second embodiment of the invention.

FIG. 6 shows the internal structure of another semiconductor device embodying the invention. The semiconductor device 2 comprises internal circuitry 11 implementing the functions that the semiconductor device 2 provides when used as a product, and an internal test circuit 21 that tests the internal circuitry 11. The semiconductor device 2 has a serial input terminal DTESIN for input of an external test control code TESIN, and an output terminal DTESOUT for external output of a test result flag TESOUT. Both of these terminals are connected to the internal test circuit 21.

The test control code TESIN is a serial code received from a tester to control the internal test circuit 21. The test result flag TESOUT is a go/no-go signal generated by the internal test circuit 21 to indicate the result of each test. Using the test control code TESIN, the tester sends the internal test circuit 21 test execution commands to carry out a plurality of tests, and test result output commands for flag output of the result of each test.

Upon receiving a TESIN control code giving a test execution command, the internal test circuit 21 generates control signals C1 to Cn to carry out a test specified by the command, supplies these control signals C1 to Cn to the internal circuitry 11, receives response signals O1 to On from the internal circuitry 11, decides whether the internal circuitry 11 passes or fails the test, and generates a test result flag TESOUT. Upon receiving a TESIN control code giving a test result output command, the internal test circuit 21 outputs the test result flag TESOUT at the DTESOUT terminal. In the following description, the '1' logic level of TESOUT indicates pass or go, and the '0' logic level indicates fail or no-go (NG).

Incidentally, the semiconductor device 2 may also have input and output terminals (not visible) coupled to the internal circuitry 11, for input of control signals and output of response signals during normal operation.

Figure 7:
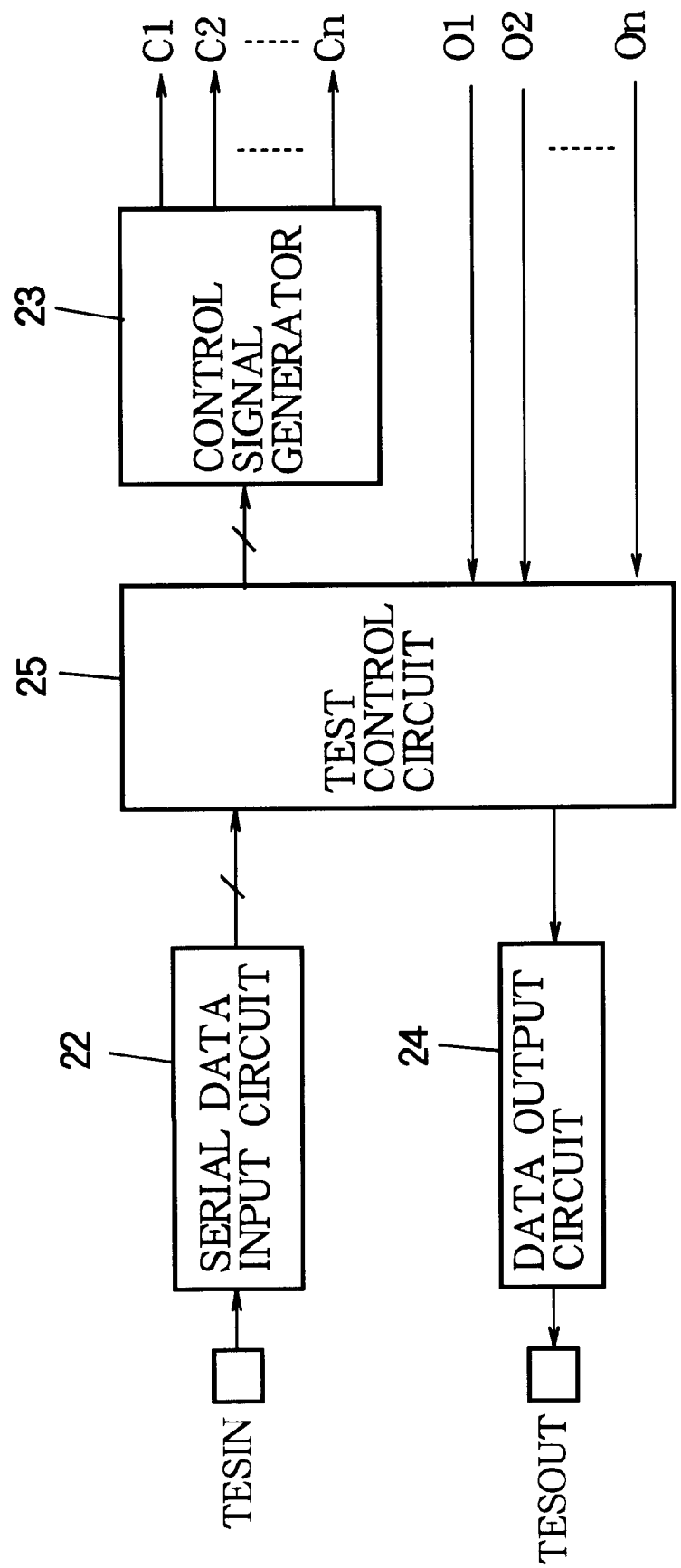
FIG. 7 is a block diagram showing the internal structure of the internal test circuit in FIG. 6.

Referring to FIG. 7, the internal test circuit 21 comprises a serial data input circuit 22, a control signal generator 23, a data output circuit 24, and a test control circuit 25.

The serial data input circuit 22 temporarily stores the serial test control code TESIN, converting it to parallel form, and supplies the parallel test control code to the test control circuit 25.

The control signal generator 23 receives commands from the test control circuit 25, generates the control signals C1 to Cn, and supplies these control signals to the internal circuitry 11.

The data output circuit 24 stores the test result flag TESOUT, setting this flag to '1' and resetting it to '0' in response to commands from the test control circuit 25. In response to a data output command from the test control circuit 25, the data output circuit 24 outputs the TESOUT value at the DTESOUT terminal. The data output circuit 24 comprises, for example, a flip-flop that stores the TESOUT flag value, and a three-state buffer disposed between the flip-flop and the DTESOUT terminal.

The test control circuit 25 decodes the test control code data received from the serial data input circuit 22. If the control code is a test execution command, the test control circuit 25 carries out the specified test, referring to stored test information such as control signal data and pass/fail criteria. On the basis of this information, the test control circuit 25 issues commands to the control signal generator 23 to generate the necessary control signals C1 to Cn, decides whether the response signals O1 to On indicate a pass or fail result, and sends a set signal or a reset signal to the data output circuit 24. If the control code is a test result output command, the test control circuit 25 sends an output command to the data output circuit 24, causing the test result flag TESOUT to be output at the DTESOUT terminal.

If some of the response signals O1 to On are analog voltage signals, the test control circuit 25 comprises, for example, an analog-to-digital (A/D) converter that converts the analog voltage to a digital value that can-be compared with digital test criteria. Alternatively, the test control circuit 25 comprises a digital-to-analog (D/A) converter that converts the digital test criteria to an analog voltage, and a comparator that compares the analog response signal with the analog voltage.

Figure 8:
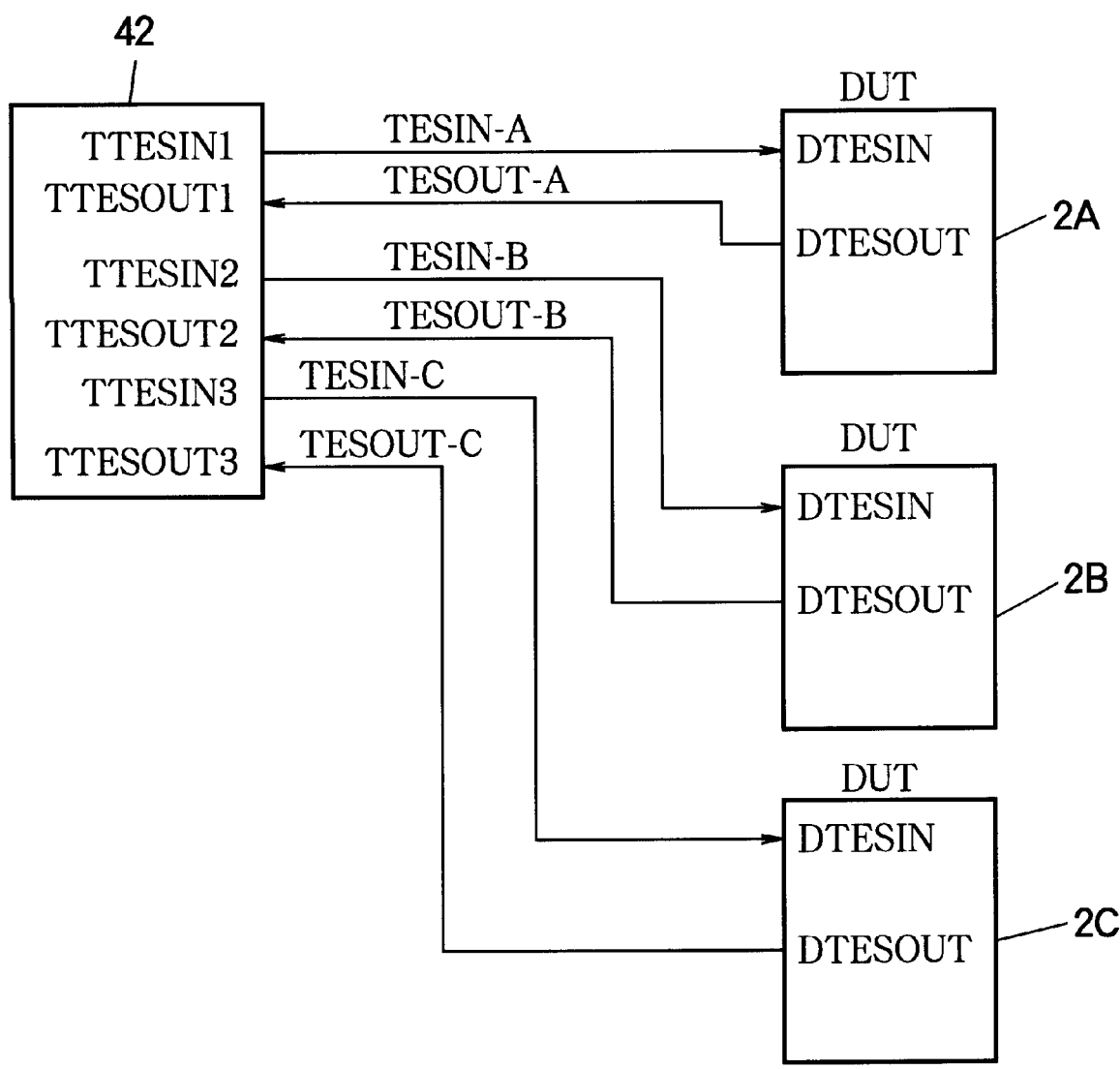
FIG. 8 is a block diagram of a parallel test system in the second embodiment.

FIG. 8 illustrates a parallel test system for testing three semiconductor devices of the type shown in FIG. 6. The three devices are identified as DUT 2A, DUT 2B, and DUT 2C. The tester 42 has three output terminals TTESIN1, TTESIN2, TTESIN3 and three input terminals TTESOUT1, TTESOUT2, TTESOUT3. Output terminal TTESIN1 is coupled to the DTESIN terminal of DUT 2A. Output terminal TTESIN2 is coupled to the DTESIN terminal of DUT 2B. Output terminal TTESIN3 is coupled to the DTESIN terminal of DUT 2C. Input terminal TTESOUT1 is coupled to the DTESOUT terminal of DUT 2A. Input terminal TTESOUT2 is coupled to the DTESOUT terminal of DUT 2B. Input terminal TTESOUT3 is coupled to the DTESOUT terminal of DUT 2C.

TESIN-A, TESIN-B, and TESIN-C are test control codes sent from the tester 42 to DUT 2A, DUT 2B, and DUT 2C, respectively, corresponding to TESIN in FIG. 6. TESOUT-A, TESOUT-B, and TESOUT-C are test result flags received by the tester 42 from DUT 2A, DUT 2B, and DUT 2C, respectively, corresponding to TESOUT in FIG. 6.

Figure 9:
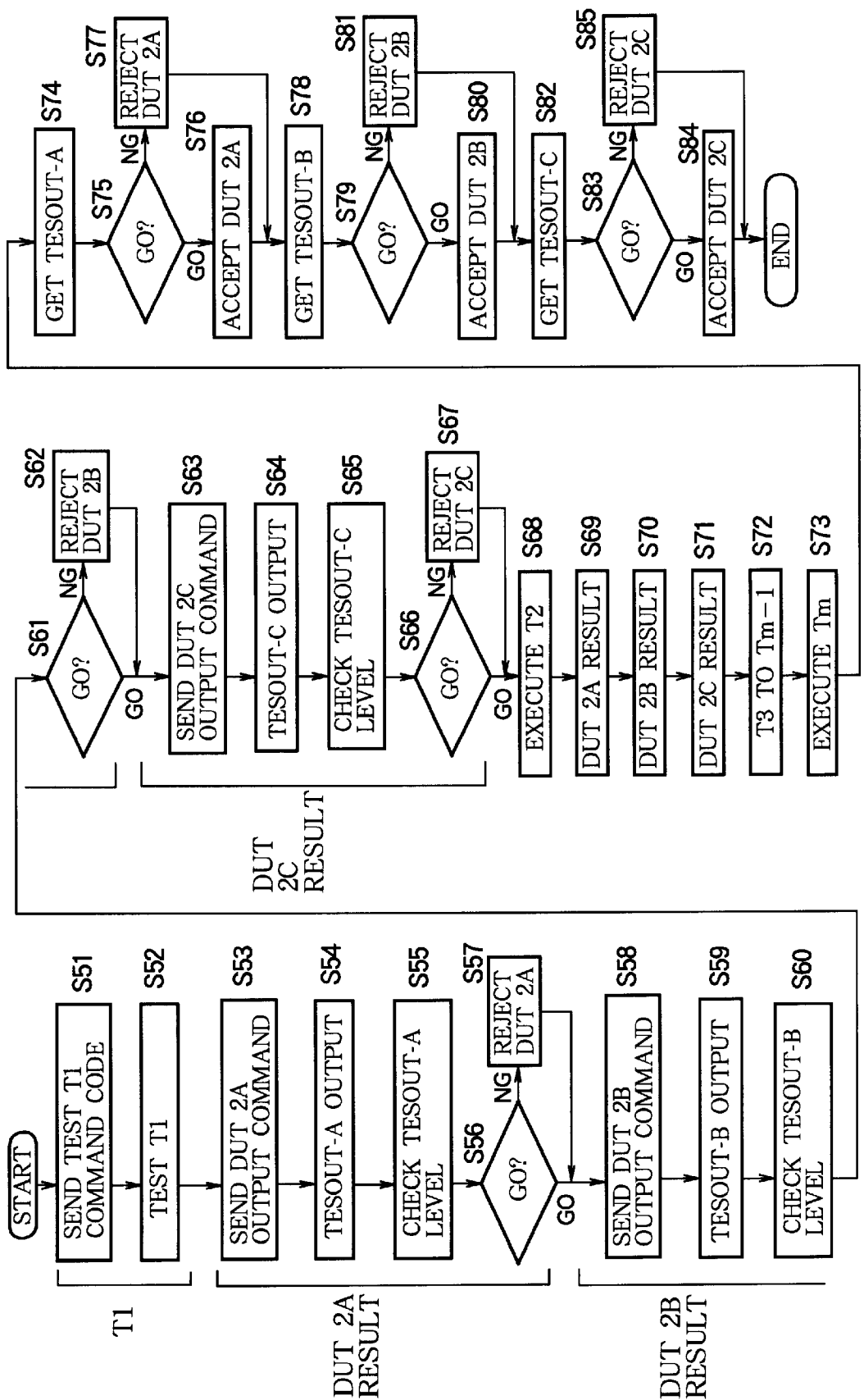
FIG. 9 is a flowchart illustrating the operation of the parallel test system in FIG. 8.

The operation of this parallel test system will be described with reference to FIG. 9. Each DUT 2A, 2B, 2C must pass m tests T1, T2, . . . , Tm.

The tester 42 begins by sending identical test control codes TESIN-A, TESIN-B, TESIN-C from terminals TTESIN1, TTESIN2, TTESIN3 to DUTs 2A, 2B, 2C, each code giving a command to execute test T1 (step S51).

In each DUT 2A, 2B, 2C, the internal test circuit 21 receives the test control code from the DTESIN terminal and executes test T1 (step S52). That is, the internal test circuit 21 generates control signals C1 to Cn, the internal circuitry 11 operates according to these control signals and generates response signals O1 to On, and the internal test circuit 21 makes a pass/fail decision and generates a test result flag, as explained above. Specifically, the serial data input circuit 22 in FIG. 7 converts the test control code TESIN-A, TESIN-B, or TESIN-C to parallel data. The test control circuit 25 decodes the parallel data, recognizes a command to execute test T1, and sends the control signal generator 23 instructions for generating control signals for test T1. The control signal generator 23 generates control signals C1 to Cn according to the supplied instructions, and sends these control signals to the internal circuitry 11. The test control circuit 25 waits a certain time for the response signals O1 to On from the internal circuitry 11 to reach their final levels, then compares O1 to On with their expected values or test specification values, decides whether the internal circuitry 11 has passed or failed test T1, and sends the data output circuit 24 a set command or reset command accordingly. The test result flag in the data output circuit 24 is set to '1' if test T1 was passed and reset to '0' if test T1 was failed. The data output circuit 24 holds but does not yet output the test result flag.

After sending the test execution command for test T1, the tester 42 waits for a certain time to allow the above operations to end, then sends a test control code TESIN-A giving a test result output command from terminal TTESIN1 to DUT 2A (step S53).

Upon receiving this command, the internal test circuit 21 in DUT 2A outputs the test result flag TESOUT-A from terminal DTESOUT to terminal TTESOUT1 of the tester 42 (step S54). Specifically, the serial data input circuit 22 in FIG. 7 converts the test control code TESIN-A to parallel data. The test control circuit 25 decodes the parallel data, recognizes the test result output command, and sends a data output command to the data output circuit 24. The data output circuit 24 then outputs the test result flag TESOUT-A at the DTESOUT terminal, from which terminal the flag is transmitted to the TTESOUT1 terminal of the tester 42.

The tester 42 checks the logic level of the TESOUT-A flag at the TTESOUT1 terminal (step S55) and recognizes whether DUT 2A has passed (GO) or failed (NG) test T1 (step S56). If the result flag TESOUT-A is at the NG level, the tester 42 rejects DUT 2A as defective (step S57).

In like manner, the tester 42 sends a test control code TESIN-B giving a test result output command from terminal TTESIN2 to DUT 2B (step S58), and the test result flag TESOUT-B indicating the result of test T1 is output from terminal DTESOUT of DUT 2B to terminal TTESOUT2 of the tester 42 (step S59). The tester 42 checks the level of terminal TTESOUT2 (step S60), recognizes whether DUT 2B has passed or failed test T1 (step S61), and rejects DUT 2B as defective if it has failed (step S62).

Next, the tester 42 sends a test control code TESIN-C giving a test result output command from terminal TTESIN3 to DUT 2C (step S63), and the test result flag TESOUT-C indicating the result of test T1 is output from terminal DTESOUT of DUT 2C to terminal TTESOUT3 of the tester 42 (step S64). The tester 42 checks the level of terminal TTESOUT3 (step S65), recognizes whether DUT 2C has passed or failed test T1 (step S66), and rejects DUT 2C as defective if it has failed (step S67).

If all-three DUTs 1A, 1B, 1C fail test Ti, the test procedure ends forthwith. Otherwise, the tester 42 proceeds to carry out test T2 on the DUTs that have not yet been rejected.

Specifically, the tester 42 sends a test control code giving a command to execute test T2 to the non-rejected DUTs, and the internal test circuit 21 in these DUTs executes test T2 (step S68). If, for example, DUT 2A failed test T1 while DUTs 2B and 2C passed, the tester 42 outputs test control codes TESIN-B and TESIN-C, but not TESIN-A. If DUTs 2A, 2B, 2C all passed test T1, the tester 42 outputs three test control codes TESIN-A, TESIN-B, TESIN-C. In the DUTs that receive test control codes, the internal test circuit 21 generates control signals C1 to Cn for test T2, the internal circuitry 11 operates according to these control signals, generating response signals O1 to On, and the internal test circuit 21 makes a pass/fail decision and generates a test result flag. Step S68 is equivalent to steps S51 and S52, except that DUTs which have already been rejected are not tested.

Next, if DUT 2A has executed test T2, the tester 42 obtains the result of the test (step S69). Specifically, the tester 42 sends a test control code TESIN-A giving a test result output command, the internal test circuit 21 in DUT 2A outputs a test result flag TESOUT-A, and the tester 42 checks the level of terminal TTESOUT1, recognizes whether DUT 2A has passed or failed test T2, and rejects DUT 2A if it has failed. Step S69 is identical to steps S53 to S57.

Similarly, if DUT 2B has executed test T2, the tester 42 commands DUT 2B to send test result flag TESOUT-B to terminal TTESOUT2, and rejects DUT 2B if it has failed test T2 (step S70). Step S70 is identical to steps S58 to S62.

Likewise, if DUT 2C has executed test T3, the tester 42 commands DUT 2C to send test result flag TESOUT-C to terminal TTESOUT3, and rejects DUT 2C if it has failed test T2 (step S71). Step S71 is identical to steps S63 to S67.

Proceeding in this manner, the tester 42 carries out tests T3 to Tm−1(step S72). Each test is carried out on the DUTs that have not yet been rejected. If at some point all DUTs are rejected, the test procedure ends.

Finally, the tester 42 sends a test control code giving a command to execute test Tm to the still non-rejected DUTS, and the internal test circuit 21 in these DUTs executes test Tm (step S73).

If DUT 2A has executed test Tm, the tester 42 sends a test control code TESIN-A giving a test result output command from terminal TTESIN1 to DUT 2A, and receives the test result flag TESOUT-A at terminal TTESOUT1 (step S74). The tester 42 thereby recognizes whether DUT 2A has passed or failed test Tm (step S75), accepts DUT 2A as non-defective if it has passed (step S76), and rejects DUT 2A as defective if it has failed (step S77).

Similarly, if DUT 2B has executed test Tm, the tester 42 sends a test control code TESIN-B giving a test result output command from terminal TTESIN2 to DUT 2B and receives the test result flag TESOUT-B at terminal TTESOUT2 (step S78), recognizes whether DUT 2B has passed or failed test Tm (step S79), accepts DUT 2B as non-defective if it has passed (step S80), and rejects DUT 2B as defective if it has failed (step S81).

Likewise, if DUT 2C has executed test Tm, the tester 42 sends a test control code TESIN-C giving a test result output command from terminal TTESIN3 to DUT 2C, receives the test result flag TESOUT-C at terminal TTESOUT3 (step S82), recognizes whether DUT 2C has passed or failed test Tm (step S83), accepts DUT 2C as non-defective if it has passed (step S84), and rejects DUT 2C as defective if it has failed (step S85). This completes the test procedure.

The second embodiment reduces the required number of tester terminals to just two terminals per DUT. A large number of devices (many more than the three shown in FIG. 8) can thus be connected simultaneously to the same tester and tested concurrently.

Control signals C1 to Cn are generated concurrently in each DUT, and the internal circuitry 11 in each DUT operates concurrently, generating response signals O1 to On. In addition, these response signals are compared with the test specifications concurrently by the internal test circuits 21 in all DUTs, and pass/fail decisions are made concurrently in the DUTs, so that the tester 42 only has to obtain the test result flags. The tester 42 can obtain and check these test result flags very quickly, so overall test time is shortened considerably.

In a variation of the second embodiment, the two terminals DTESIN and DTESOUT of each semiconductor device 2 are combined into a single terminal, which operates first as an input terminal to receive the test control code TESIN, then as an output terminal for output of the test result flag TESOUT.

In another variation, the test control codes are sent in parallel form. The DTESIN and TTESIN terminals are replaced by respective pluralities of terminals.

In another variation, the tester 42 has a single TTESOUT terminal, which is connected to the DTESOUT terminals of all devices under test.

In another variation, the data output circuit 24 in each DUT outputs the test result flag TESOUT at all times, so that the tester 42 does not need to send a test result output command to each DUT. In this variation, the tester 42 may have a single TTESIN terminal which is connected to the DTESIN terminals of all devices under test.

Third Embodiment

Figure 10:
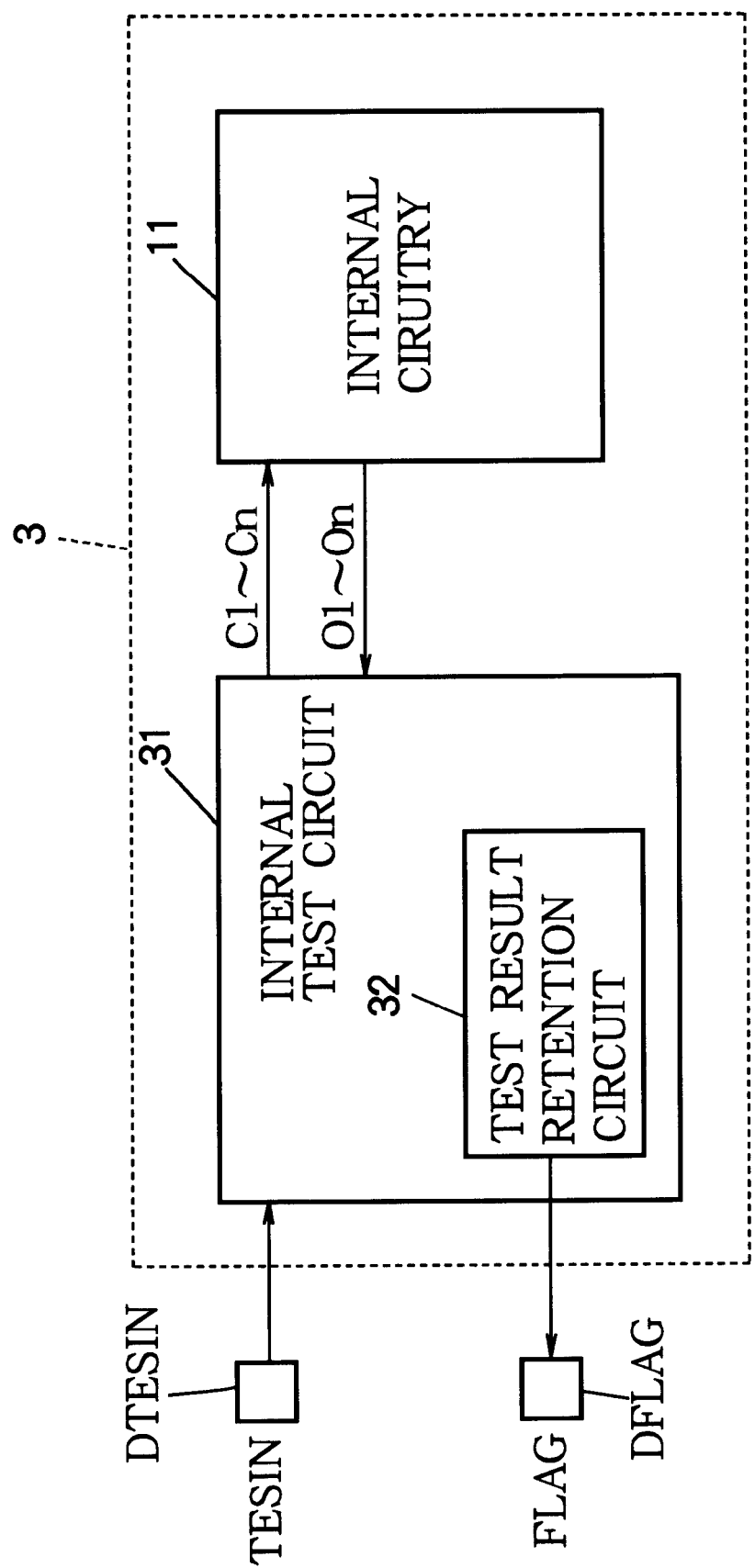
FIG. 10 is a block diagram of a semiconductor integrated-circuit device in a third embodiment of the invention.

FIG. 10 shows the internal structure of another semiconductor device embodying the invention. The semiconductor device 3 comprises internal circuitry 11 implementing the functions that the semiconductor device 1 provides when used as a product, and an internal test circuit 31 that tests the internal circuitry 11. The internal test-circuit 31 includes a test result retention circuit 32. The semiconductor device 3 has a serial input terminal DTESIN for input of a test control code TESIN, and an output terminal DFLAG for output of a product decision flag (denoted FLAG) from the test result retention circuit 32.

The test control code TESIN is a serial code that directs the internal test circuit 31 to carry out a specified test. The product decision flag is a go/no-go signal generated by the internal test circuit 31 to indicate whether the semiconductor device 3 is non-defective, meaning that it has passed all tests so far, or defective, meaning that it has failed a test.

The internal test circuit 31 receives a continuous series of TESIN control codes giving different test execution commands, and carries out the specified tests one after another. For each test, the internal test circuit 31 generates the necessary control signals C1 to Cn, applies these control signals to the internal circuitry 11, receives response signals O1 to On from the internal circuitry 11, and decides whether the internal circuitry 11 has passed or failed the test. The product decision flag is set to the value indicating a non-defective device ('1' in the following description) at the beginning of the series of tests, and is reset to the value indicating a defective device ('0' in the following description) if the internal circuitry 11 fails any one of the tests. The test result retention circuit 32 stores the flag value in a non-volatile manner, and outputs the flag value at the DFLAG output terminal whenever power is supplied to the semiconductor device 3.

Figure 11:
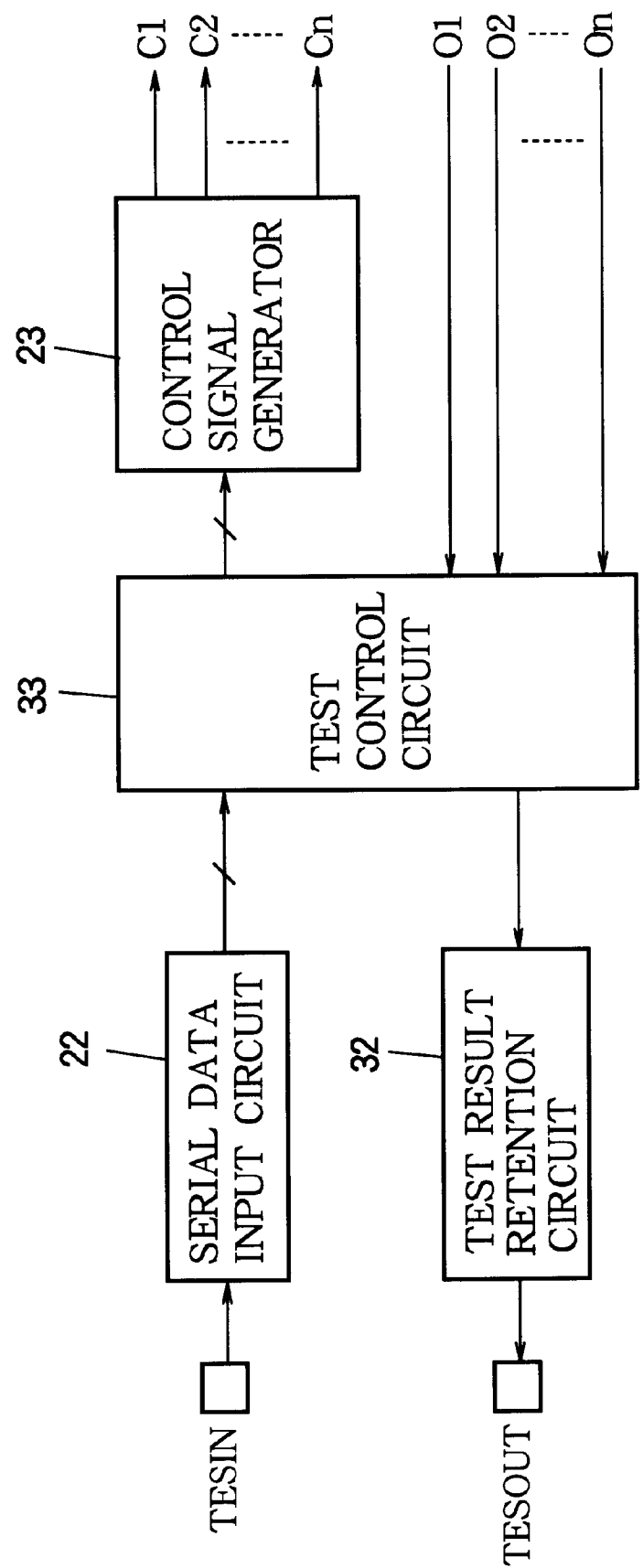
FIG. 11 is a block diagram showing the internal structure of the internal test circuit in FIG. 10.

Referring to FIG. 11, the internal test circuit 31 comprises a serial data input circuit 22, a control signal generator 23, the test result retention circuit 32, and a test control circuit 33. The serial data input circuit 22 and control signal generator 23 have the same functions as in the second embodiment.

The test control circuit 33 decodes each test control code TESIN as it is received from the serial data input circuit 22, and temporarily stores the decoded information. The test control circuit 33 executes each specified test by having the control signal generator 23 generate control signals C1 to Cn, and comparing the response signals O1 to On from the internal circuitry 11 with prestored test specification values. The test control circuit 33 executes the tests in the order in which the test commands are received, on the basis of the temporarily stored decoded information. If a test is failed, the test control circuit 33 sends a reset command to the test result retention circuit 32, and omits further tests.

Figure 12:
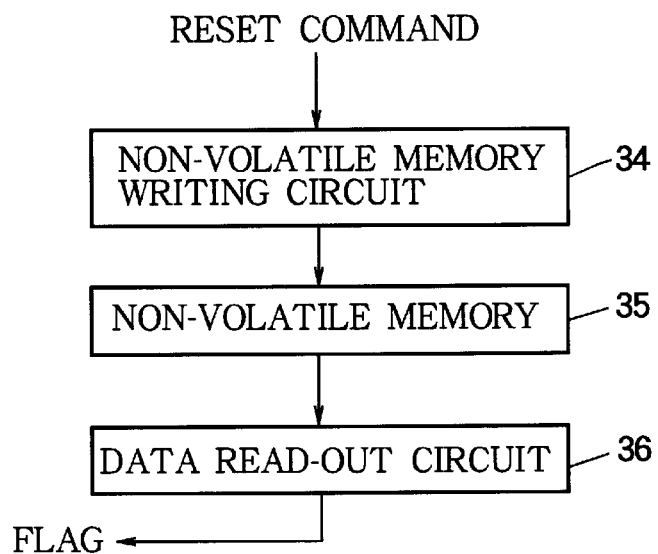
FIG. 12 is a block diagram showing the internal structure of the test result retention circuit in FIG. 11.

Referring to FIG. 12, the test result retention circuit 32 comprises a non-volatile memory writing circuit 34, a non-volatile memory 35, and a data read-out circuit 36. The non-volatile memory 35 stores the value of the product decision flag. Initially, the product decision flag is set to '1.' The non-volatile memory writing circuit 34 responds to the reset command from the test control circuit 33 by writing a '0' in the non-volatile memory 35, thereby resetting the product decision flag. The data read-out circuit 36 outputs the product decision flag value to the DFLAG terminal at all times, provided power is supplied to the semiconductor device 3.

The non-volatile memory 35 is, for example, a non-volatile memory cell such as a ferroelectric random-access memory (FRAM) cell, an electrically programmable read-only memory (EPROM) cell, or an electrically erasable and programmable read-only memory (EEPROM) cell. The non-volatile memory 35 may also comprise a fuse or another type of circuit element that is initially in one state but can be reset to another state.

Figure 13:
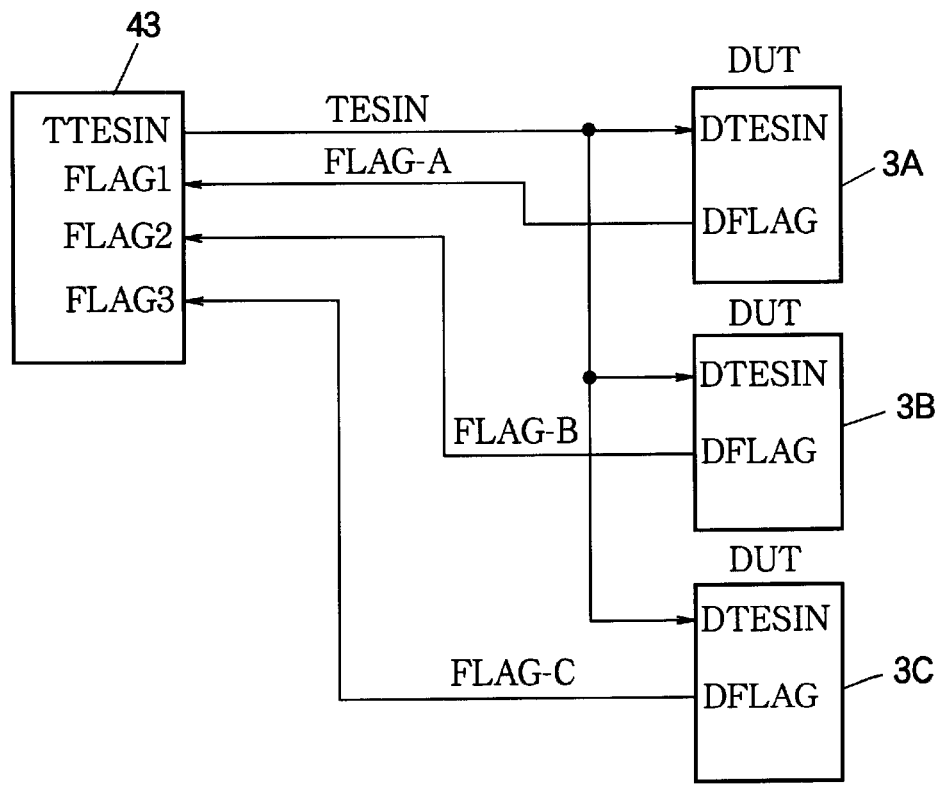
FIG. 13 is a block diagram of a parallel test system in the third embodiment.

FIG. 13 illustrates a parallel test system for testing three semiconductor devices of the type shown in FIG. 10. The three devices are identified as DUT 3A, DUT 3B, and DUT 3C. The tester 43 has one output terminal TTESIN and three input terminals FLAG1, FLAG2, FLAG3. The output terminal TTESIN is coupled to the DTESIN terminals of all three DUTs 3A, 3B, 3C. Input terminal FLAG1 is coupled to the DFLAG terminal of DUT 3A. Input terminal FLAG2 is coupled to the DFLAG terminal of DUT 3B. Input terminal FLAG3 is coupled to the DFLAG terminal of DUT 3C.

FLAG-A, FLAG-B, and FLAG-C are the product decision flags received by the tester 43 from DUT 3A, DUT 3B, and DUT 3C, respectively, corresponding to FLAG in FIG. 10.

Figure 14:
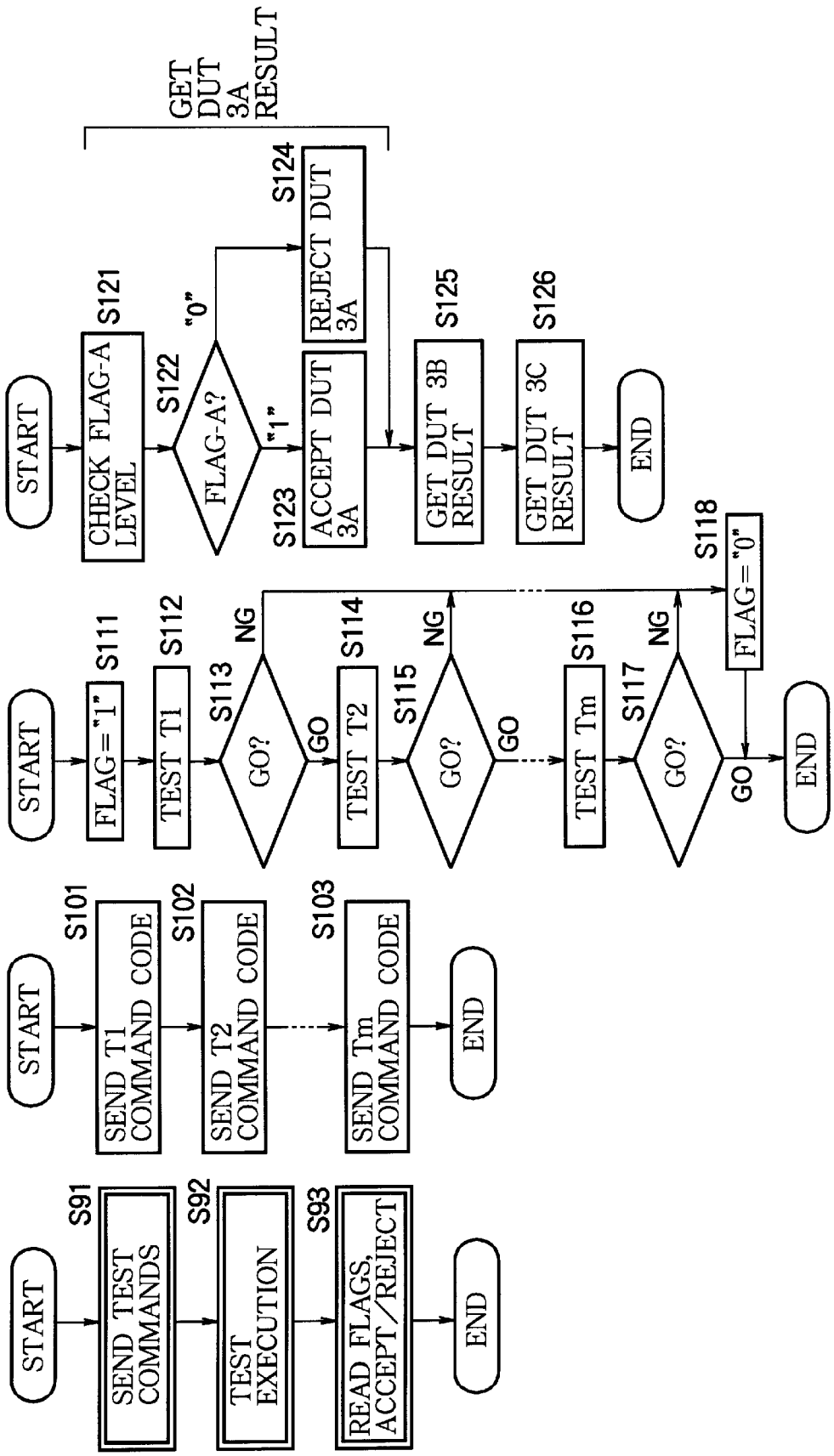
FIGS. 14A, 14B, 14C, and 14D are flowcharts illustrating the operation of the parallel test system in FIG. 13.

The operation of this parallel test system will be described with reference to FIGS. 14A, 14B, 14C, and 14D. Each DUT 3A, 3B, 3C must pass m tests T1, T2, . . . , Tm, as in the second embodiment. FIG. 14A illustrates the overall test procedure. FIGS. 14B, 14C, and 14D illustrate the three steps S91, S92, S93 in FIG. 14A.

Before the test begins, the non-volatile memory 35 is tested independently to verify correct operation.

To begin the test, the tester 43 sends a continuous series of test control codes from its TTESIN terminal to the DTESIN terminals of DUTs 3A, 3B, 3C, giving commands to executes tests T1, T2, . . . , Tm (step S91 in FIG. 14A). Specifically, the tester 43 sends the test T1 execution command code (step S101 in FIG. 14B), then sends the test T2 execution command code (step S102), and continues in this way until the test Tm execution command code has been sent (step S103).

In each DUT, the internal test circuit 31 executes the commanded series of tests (step S92 in FIG. 14A). First, the product decision flag stored in the test result retention circuit 32 is initialized to '1' (step S111 in FIG. 14C). Next, test T1 is executed (step S112), the internal circuitry 11 receiving control signals C1 to Cn and returning response signals O1 to On. From the response signals, the test control circuit 33 decides whether the internal circuitry 11 passes (go) or fails (no-go) test T1 (step S113). If the internal circuitry 11 passes test T1 (GO), the test control circuit 33 proceeds to execute test T2 (step S114) and decide whether the internal circuitry 11 passes or fails test T2 (step S115). If the internal circuitry 11 passes test T2, the test control circuit 33 executes the succeeding tests in the same way, finally executing test Tm (step S116) and deciding whether the internal circuitry 11 passes or fails (step S117). If the internal circuitry 11 fails (NG) any one of these tests T1 to Tm, the test control circuit 33 commands the test result retention circuit 32 to reset the product decision flag to '0' (step S118) and terminates the test sequence. Thus test Tj is executed only if the internal circuitry 11 passes all of tests T1 to Tj-1 (j=2, 3, . . . , m). At the end of this procedure the product decision flag has the value '1' if the internal circuitry 11 passed all m tests, and the value '0' if the internal circuitry 11 failed any one of the tests.

Next, the tester 43 reads the product decision flags and accepts or rejects the devices under test (step S93 in FIG. 14A). Specifically, the tester 43 checks the level of FLAG-A at the FLAG1 input terminal (step S121), decides whether the value of FLAG-A is '1' or '0' (step S122), accepts DUT 3A as non-defective if the flag value is '1' (step S123), and rejects DUT 3A as defective if the flag value is '0' (step S124). Next, the tester 43 checks FLAG-B and accepts or rejects DUT 3B in the same way (step S125). Finally, the tester 43 checks FLAG-C and accepts or rejects DUT 3C (step S126).

The final values of the product decision flags remain stored in the test result retention circuit 32 in each DUT, so the third step S93 in FIG. 14A does not have to be carried out immediately after steps S91 and S92. The devices under test can be disconnected from the tester 43 after the second step S92, and the product decision flags can be read at an arbitrary later time, by the tester 43 or by another device, simply by supplying power to the semiconductor devices 3 and checking the logic level at their DFLAG terminals.

In the third embodiment, the tester 43 requires only one flag input terminal per DUT, and one test control code output terminal for all of the DUTs. A large number of DUTs can thus be connected to the tester 43 and tested concurrently. As in the second embodiment, the test operations and the operations of determining whether each test is passed or failed are carried out internally in all of the DUTs at once, but instead of receiving a test result flag for each test, the tester 43 now receives only one final product decision flag from each DUT. The test procedure in the third embodiment can thus be completed even more quickly than the procedure in the second embodiment.

In addition, the final test result remains stored in each semiconductor device 3 after the test, and can be obtained later, simply by supplying power to the semiconductor device 3, as noted above. Thus, the tester 43 can be devoted entirely to generating and sending the test control codes, leaving the results to be read later from the semiconductor devices 3 by other, simpler equipment. Having the final test result stored in the semiconductor device 3 itself also provides protection against various types of handling errors or record-keeping errors that may create doubt as to whether a device that has already been tested is defective or not.

The test procedure shown in FIGS. 14A, 14B, 14C, and 14D can also be employed in the second embodiment, provided the test control circuit 25 is capable of temporarily storing the decoded test control codes. That is, the tester 42 can send the test execution commands for tests T1 to Tm in a continuous series, and receive only the final values of the test result flags, instead of receiving the results of each test. The final results must be received before the power supply of the devices under test is switched off, however, because the data output circuit 24 lacks a nonvolatile storage capability.

Figure 15:
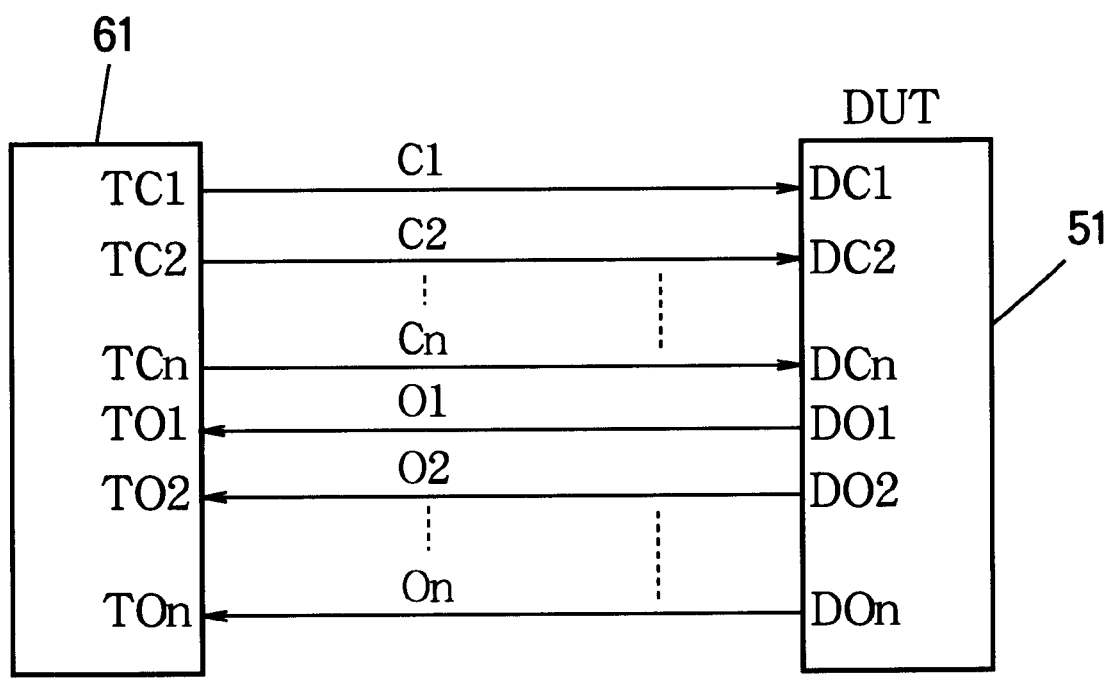
FIG. 15 is a block diagram illustrating a conventional single test system.

For comparison with the present invention, FIG. 15 shows a conventional single test system, in which only one DUT 51 is connected to the tester 61. The DUT 51 has input terminals DC1 to DCn that receive control signals C1 to Cn from output terminals TC1 to TCn of the tester 61, and output terminals DO1 to DOn from which response signals O1 to On are returned to input terminals TO1 to TOn of the tester. The DUT 51 performs the functions of the internal circuitry 11 in FIG. 1, but has no selection circuit.

Figure 16:
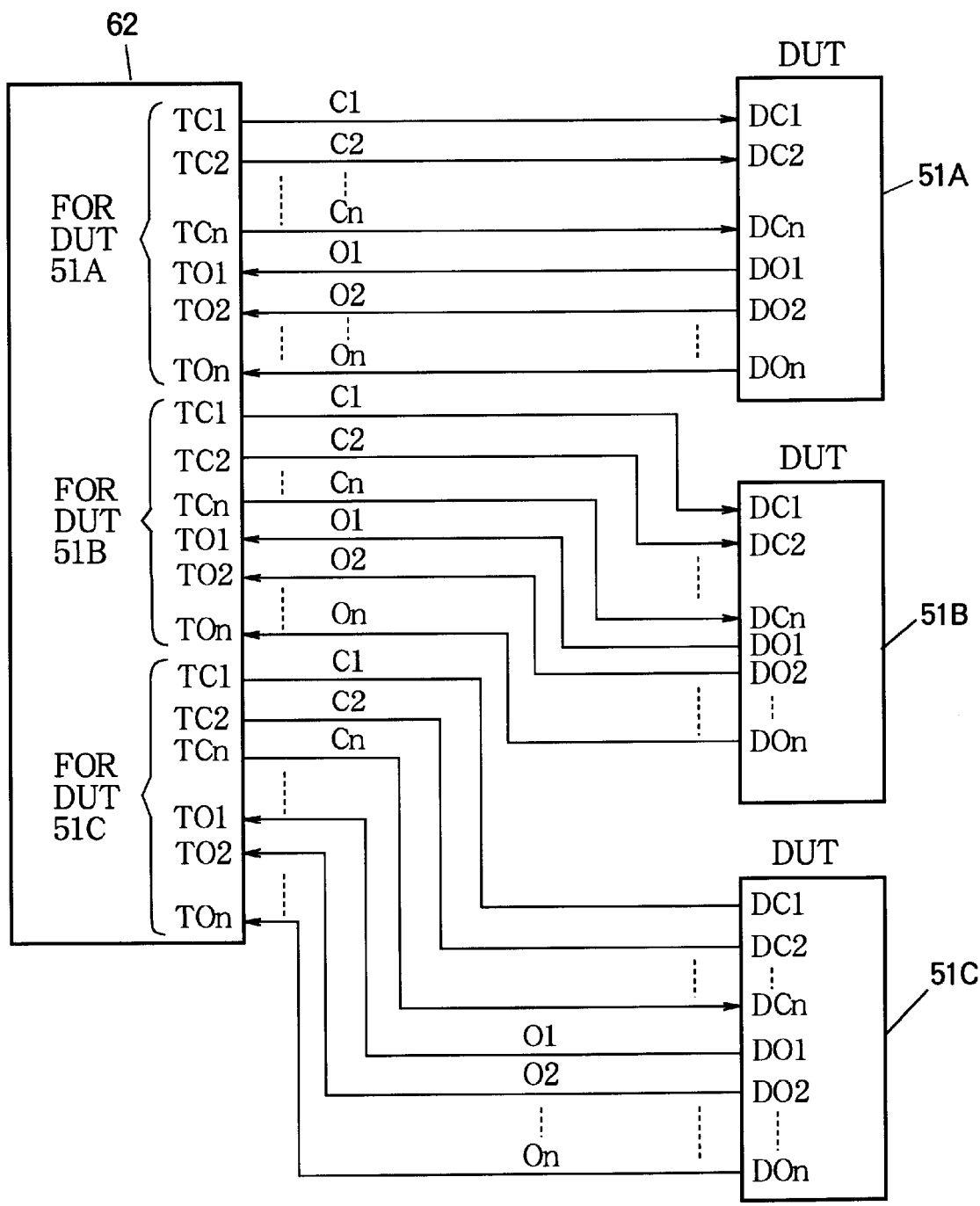
FIG. 16 is a block diagram illustrating a conventional parallel test system.

FIG. 16 shows a conventional parallel test system, in which three devices 51A, 51B, 51C of the type in FIG. 15 are coupled to the tester 62. The tester 62 has three complete sets of output terminals TC1 to TCn, one set connected to each DUT, and three complete sets of input terminals TO1 to TOn, one set connected to each DUT.

Figure 17:
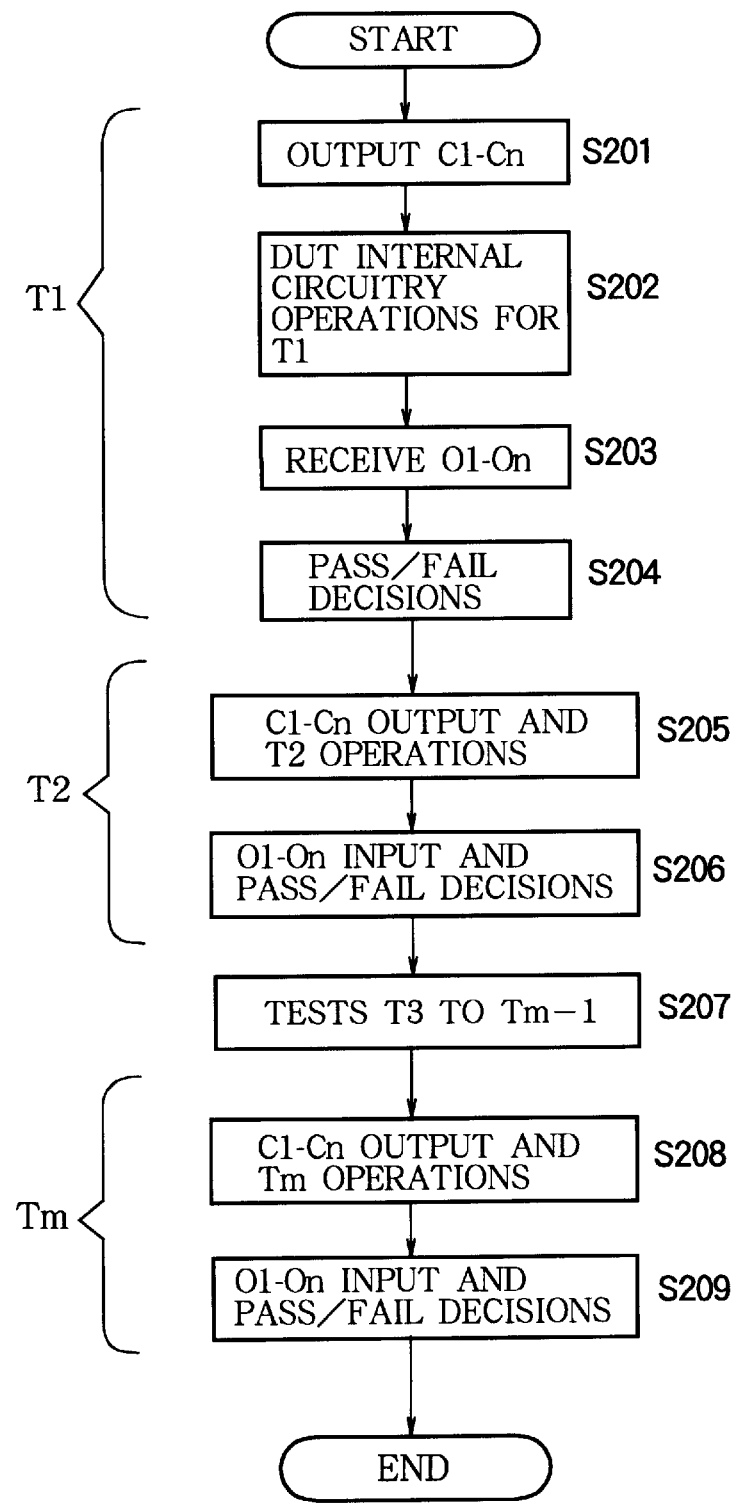
FIG. 17 is a flowchart illustrating the operation of the parallel test system in FIG. 16.

FIG. 17 illustrates the conventional parallel test procedure. To carry out the first test T1, the tester 62 sends control signals C1 to Cn to the three DUTs 51A, 51B, 51C (step S201), which operate according to the control signals (step S202). The tester 62 then receives the response signals O1 to On from all three DUTs 51A, 51B, 51C simultaneously (step S203), processes the response signals by comparing them with test specification values, and decides whether each DUT passes or fails test T1 (step S204). Test T2 is carried out in the same way (steps S205 and S206) on the devices that passed test T1, step S205 corresponding to steps S201 and S202, and step S206 corresponding to step S203 and S204. Tests T3 to Tm−1 are carried out similarly, each test being performed on the devices that have not failed any tests so far (step S207). Finally, the tester 62 issues control signals for test Tm to the devices that passed test Tm−1(step S208), obtains response signals from these devices, and decides whether they pass or fail (step S209).

The tester 62 in the parallel test system in FIG. 16 has more input and output terminals than any of the testers 41, 42, 43 in the above embodiments of the invention. The number of output terminals can be reduced to a single set of terminals TC1 to TCn to which all devices under test are connected, but the total number of input and output terminals still remains higher than the number in FIGS. 3, 8, and 13 (provided n>1, which is almost always the case).

The parallel test procedure in FIG. 17 may appear faster than the procedures in the embodiments above, because the tester 62 receives and processes all response signals concurrently, but the processing capability of the tester 62 is limited. Typically, the response signals from all devices under test are processed by the same microprocessor in the tester 62. The processing time is then substantially the same as in the first embodiment, and exceeds the processing time in the second and third embodiments, in which most of the processing is carried out in the DUTs themselves.

Several variations of the embodiments have been described, but those skilled in the art will recognize that further variations are possible within the scope of the invention as claimed below.

What is claimed is:

1. A method of testing a plurality of semiconductor integrated circuits having respective internal circuitry and respective selection circuits, the internal circuitry receiving control signals, performing functions that the semiconductor integrated circuits provide as a product, and generating response signals, the selection circuits receiving respective external selection signals having a first state and a second state, providing external output of the response signals when said respective external selection signals are in the first state, and blocking external output of the response signals when said respective external selection signals are in the second state, the method comprising the steps of:

connecting all of the semiconductor integrated circuits in common to a single set of control signal output terminals of a tester, and to a single set of response signal input terminals of the tester;

connecting each of the semiconductor integrated circuits to a separate selection signal output terminal of the tester, for sending said respective external selection signals to the selection circuits in the semiconductor integrated circuits;

simultaneously sending said control signals from the tester to all of the semiconductor integrated circuits;

selecting the semiconductor integrated circuits one by one, by placing their external selections signals in the first state; and making a pass/fail decision for each said semiconductor integrated circuit among said semiconductor integrated circuits by processing the response signals received from the semiconductor integrated circuit when the semiconductor integrated circuit is selected.

2. The method of claim 1, wherein said selection circuits receive respective external control signals, and pass said respective external control signals as said control signals to the internal circuitry when and only when said respective external selection signals are in the first state.

3. The method of claim 1, further comprising the step of placing said internal circuitry in a standby state when said respective external selection signals are in the first state.

4. A method of testing a plurality of semiconductor integrated circuits having respective internal circuitry and respective internal test circuits, the internal circuitry receiving control signals, performing functions that the semiconductor integrated circuit provides as a product, and generating response signals, the internal test circuits receiving a first external test control code giving test execution commands, generating said control signals according to the first external test control code, supplying said control signals to the internal circuitry, receiving the response signals from the internal circuitry, making a pass/fail decision according to the response signals, receiving a second external test control code giving a test result output command, and providing external output of the pass/fail decision in response to the second external test control code, the method comprising the steps of:

(a) sending the first external test control code to the plurality of semiconductor integrated circuits;

(b) repeating step (a), varying the first external test control code to carry out different tests;

(c) sending the second external test control code to the plurality of semiconductor integrated circuits; and (d) receiving the pass/fail decision from each one of the plurality of semiconductor integrated circuits.

5. The method of claim 4, wherein the first external test control code is sent simultaneously to the plurality of semiconductor integrated circuits in said step (a).

6. A method of testing a plurality of semiconductor integrated circuits having respective internal circuitry, respective internal test circuits, and respective non-volatile memories, the internal circuitry receiving control signals, performing functions that the semiconductor integrated circuit provides as a product, and generating response signals, the internal test circuits receiving an external test control code giving test execution commands, generating said control signals according to the external test control code, supplying said control signals to the internal circuitry, receiving the response signals from the internal circuitry, and making a pass/fail decision according to the response signals, the method comprising the steps of:

(a) sending the external test control code to the plurality of semiconductor integrated circuits;

(b) repeating step (a), varying the external control code to carry out different tests;

(c) storing each pass/fail decision made by said respective internal test circuits in said respective non-volatile memories in the semiconductor integrated circuits; and (d) receiving the pass/fail decision from each one of the plurality of semiconductor integrated circuits.

7. The method of claim 6, wherein said steps (a) to (c) are carried out while the plurality of semiconductor integrated circuits are connected to a tester, and said step (d) is carried out after the plurality of semiconductor integrated circuits are disconnected from the tester.

8. The method of claim 6, wherein the external test control code is sent simultaneously to the plurality of semiconductor integrated circuits in said step (a).

9. The method of claim 6, wherein said step (c) is carried out by said respective internal test circuits.

* * * * *